US006778282B1

United States Patent
Smets et al.

(10) Patent No.: US 6,778,282 B1
(45) Date of Patent: Aug. 17, 2004

(54) MEASURING POSITIONS OF COPLANARITY OF CONTRACT ELEMENTS OF AN ELECTRONIC COMPONENT WITH A FLAT ILLUMINATION AND TWO CAMERAS

(75) Inventors: Carl Smets, Haasrode (BE); Karel Van Gils, Blanden (BE); Maarten Van Der Burgt, Kessel-Lo (BE)

(73) Assignee: ICOS Vision Systems N.V. (BE)

( * ) Notice: Subject to any disclaimer, the term of this patent is extended or adjusted under 35 U.S.C. 154(b) by 0 days.

(21) Appl. No.: 09/958,516

(22) PCT Filed: Mar. 1, 2000

(86) PCT No.: PCT/BE00/00020

§ 371 (c)(1),
(2), (4) Date: Oct. 10, 2001

(87) PCT Pub. No.: WO00/62012

PCT Pub. Date: Oct. 19, 2000

(30) Foreign Application Priority Data

Apr. 13, 1999 (EP) .............................. 99201121

(51) Int. Cl.[7] ................................ G01B 11/14
(52) U.S. Cl. .................... 356/614; 356/237.1; 382/145; 382/149
(58) Field of Search ................. 356/614–623, 356/394, 237.4–237.5; 382/148, 150, 145, 146; 348/126, 87; 250/559.4, 559.46

(56) References Cited

U.S. PATENT DOCUMENTS

| 5,574,801 A | * | 11/1996 | Collet-Beillon ............. 382/150 |
| 5,621,530 A | | 4/1997 | Marrable, Jr. |
| 5,943,125 A | * | 8/1999 | King et al. .............. 356/237.1 |
| 5,956,134 A | | 9/1999 | Roy et al. |
| 6,064,756 A | * | 5/2000 | Beaty et al. ................ 382/146 |
| 6,064,757 A | * | 5/2000 | Beaty et al. ................ 382/147 |
| 6,072,898 A | * | 6/2000 | Beaty et al. ................ 382/146 |
| 6,201,892 B1 | * | 3/2001 | Ludlow et al. ............. 382/149 |
| 2002/0034324 A1 | * | 3/2002 | Beaty et al. ................ 382/145 |
| 2002/0037098 A1 | * | 3/2002 | Beaty et al. ................ 382/145 |

FOREIGN PATENT DOCUMENTS

WO    WO 99/00661    1/1999

* cited by examiner

Primary Examiner—Hoa Q. Pham
(74) Attorney, Agent, or Firm—Piper Rudnick LLP

(57) ABSTRACT

A method and an apparatus for measuring respective positions of a set of contact elements of an electronic component, wherein the contact elements are illuminated with a light source producing a light with an incident angle of at the most 20° and wherein a first respectively a second image is recorded of said elements by means of a first respectively a second camera which are set up over a triangulation angle with respect to each other.

8 Claims, 6 Drawing Sheets first image  second image first image second image

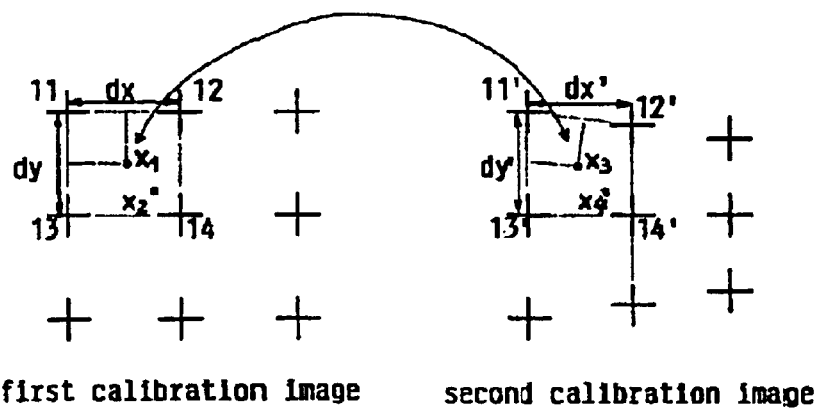
first calibration image    second calibration image
Fig. 6
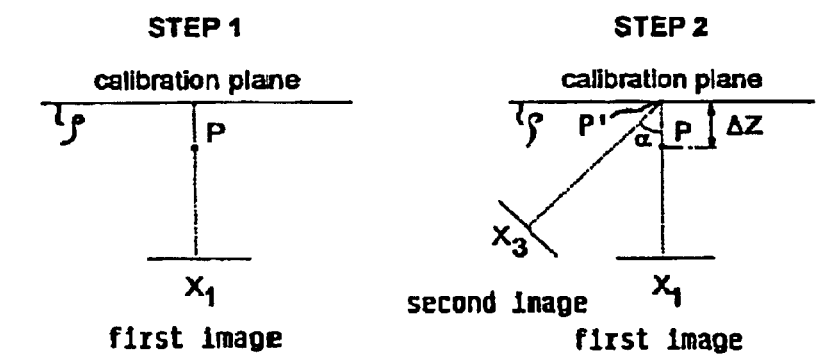
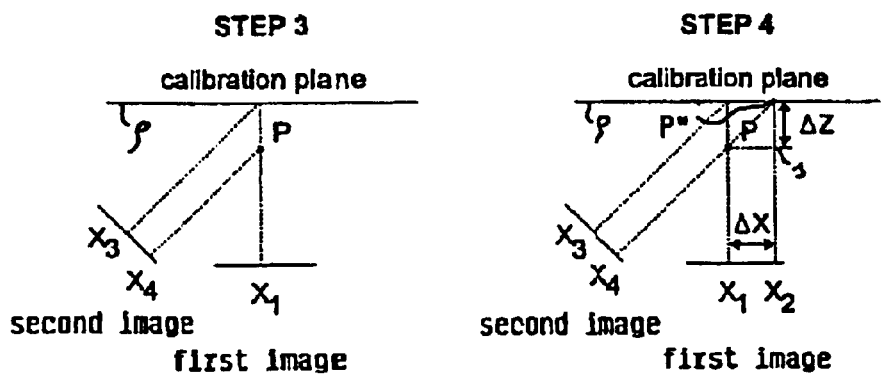
Fig. 7 first image | first template
a | b second image | second template
a | b

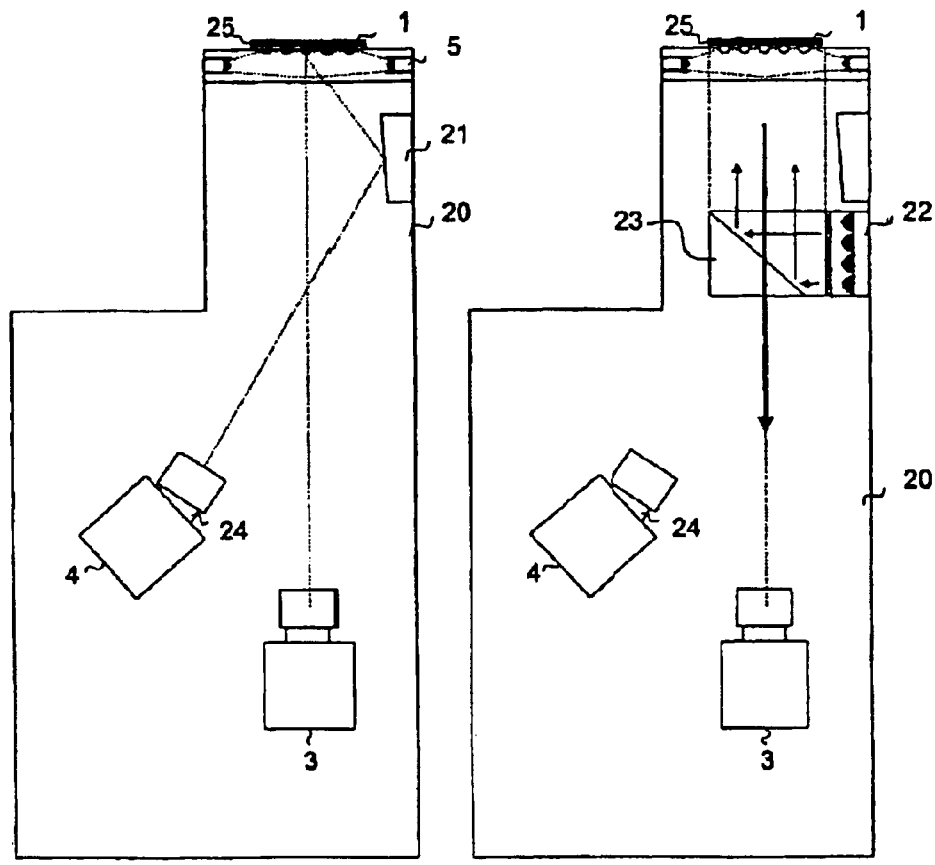
*Fig. 10*  *Fig. 11*
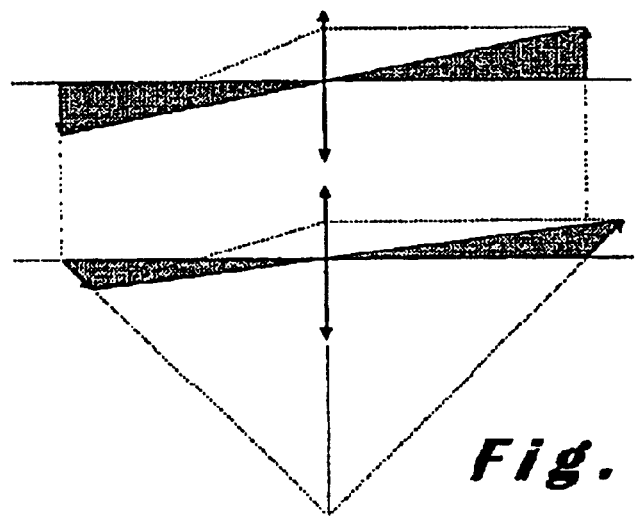
*Fig. 12*

MEASURING POSITIONS OF COPLANARITY OF CONTRACT ELEMENTS OF AN ELECTRONIC COMPONENT WITH A FLAT ILLUMINATION AND TWO CAMERAS

RELATED APPLICATION

This is a §371 of International Application No. PCT/BE00/00020, with an international filing date of Mar. 1, 2000, which is based on European Patent Application No. EP 99201121.3, filed Apr. 13, 1999.

FIELD OF THE INVENTION

The present invention relates to a method for measuring respective positions of a set of N contact elements of an electronic component.

BACKGROUND

According to the state of the art, the contact elements of the electronic component are illuminated by means of alight source and a camera is used to record an image of the contact elements. The positions of each of the contact elements are determined by using the recorded picture. The determination of these positions is important for the computation of the coplanarity of contact elements of electronic components such as BGA (Ball Grid Array)/CSP (Chip Scale Packaging) and flip-chip devices. If that coplanarity is not within predetermined and limited constraints, the necessary electrical contacts can not be made and the electronic component is useless.

It would therefore be advantageous to provide a method for measuring positions of a set of contact elements of an electronic component, without moving either the camera or the light source.

SUMMARY OF THE INVENTION

For this purpose a method according to the invention comprises:
  bringing said set of elements in a measurement plane;
  illuminating said measurement plane by means of a substantially homogeneous light source producing a light with an incident angle on said elements of at the most 20°;
  recording a first image of said elements by means of a first camera having a first image plane extending substantially in parallel with said measurement plane;
  recording a second image of said elements by means of a second camera set up over a triangulation angle α with respect to said first camera and said measurement plane, said triangulation angle being situated between 25° and 80°;
  determining within said first image for each $i^{th}$ ($1 \leq i \leq N$) element, a first image point $X_1$ of a first reference point situated on each of said elements;
  determining within said second image a second image point $X_3$ by mapping with respect to a calibration plane each time said first image point $X_1$ into said second image;
  determining with said second image, a third image point $X_4$ being the image of said first reference point;
  determining within said first image a fourth image point $X_2$ by mapping said third image point into said first image;
  determining within said first image a displacement $\Delta x_i$ between said first and fourth image point.

The first image enables to determine the X and Y position whereas the second image, in combination with the first, enables to determine the Z position or height Since two cameras are used, it is no longer necessary to move the light source or the camera. Since the two cameras are set up according to a triangulation angle with respect to each other, some distortion occurs in the second image recorded by the camera. This is however mathematically corrected as the angle is known between the two cameras. The use of a light source producing a light with an incident angle of at the most 20° enables to illuminate the component with a same light source for both cameras.

A first preferred embodiment of a method according to the present invention is characterised in that said first $X_1$ and third image point $X_4$ are determined by means of a convolution operation with a predetermined convolution pattern. The use of a convolution pattern enables an easy and reliable subpixel calculation based on the grey values of the pixels in the recorded first and second image.

A second preferred embodiment of a method according to the present invention is characterised in that said convolution pattern is a circle for said first image, and an ellipse shaped curve for said second image. Those convolution patterns fit with the images recorded when the triangulation angle is approximately 45°.

A third preferred embodiment of a method according to the present invention is characterised in that said reference point is situated offset of a top of said element. With the incident light and the chosen triangulation angle the top of the element can not be reached exactly. Therefore, a point offset with respect to the top Is considered. However as this is done for all the elements and as only the relative position is of importance, this choice fits with the chosen methodology.

The invention also relates to an apparatus for measuring respective positions of a set of contact elements of an electronic component.

BRIEF DESCRIPTION OF THE DRAWINGS

The invention will now be described in more details with reference to the drawings. In the drawings:

FIG. 6 illustrates the mapping of co-ordinates from the first to the second calibration image;

FIG. 7 illustrates the different steps of the measurement principle according to the invention;

FIGS. 10 and 11 illustrate a first and a second embodiment of an apparatus according to the present invention; and FIG. 12 illustrates the optics of a tilted image plane.

Figure 1:
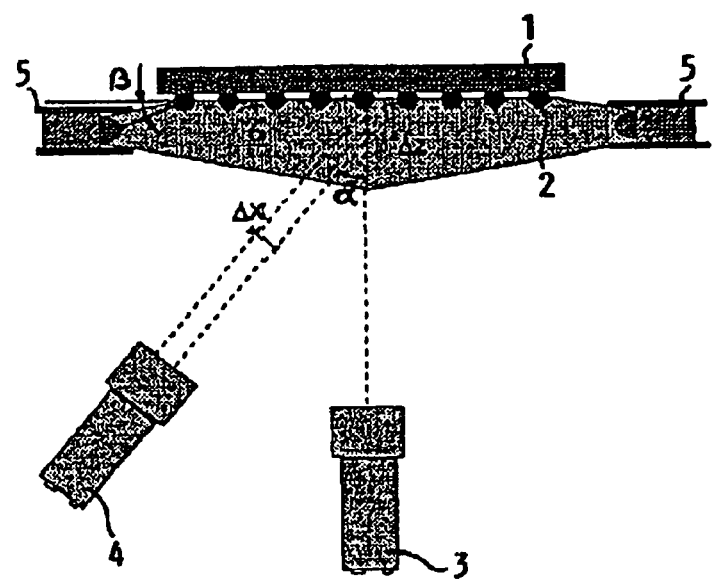
FIG. 1 illustrates schematically the set-up of the illumination and the cameras according to the present invention.

In the drawings a same reference sign has been assigned to a same or analogous element.

DETAILED DESCRIPTION

The method according to the invention is designed for the automatic computation of the coplanarity of contact elements of electronic components such as BGA (Ball Grid Array)/CSP (Chip Scale Packaging) and flip-chip devices. As illustrated in FIG. 1, the electronic component 1 is placed in a measurement plane, in such a manner, that its N contact elements 2 are illuminated by an illumination source 5. The latter produces a homogeneous illumination of the contact elements at a low incident angle β, which is at the most 20°. Preferably, the light illumination source comprises a high-quality right-light illumination source. Such a source is built up of a series of LED's which are disposed in a ring, square, hexagonal or other substantially planar geometrical arrangement situated under the plane in which the contact elements are placed. It is important that a substantially homogeneous light field 6 is created which covers the volume in which the contact elements 2 of the component are located. In such a manner, a substantially homogeneous illumination of different contact elements is obtained. In order to obtain a symmetrical illumination, the amount of the angle will be determined by the dimension of the component to be measured. The larger the component, the larger the angle. So, for example, for a component of 40×40 mm, the diameter of the ring will be 15 cm and β=15° whereas for a component of less than 15×15 mm, β=10°.

Since the light source 5 illuminates the surface on which the contact elements are placed from the peripheral of the surface, the sides of the contact elements, generally formed by balls, are illuminated. A first camera 3 and a second camera 4, placed under the measurement plane where the electronic component is situated, record the light reflected by the contact elements. The cameras are preferably CCD cameras. The first and second camera are set up in such a manner as to make a triangulation angle α with each other and with respect to the measurement plane, which angle is situated between 25≦α≦80°, preferably 45° for facilitating the calculation as will be described hereinafter.

Figure 2:
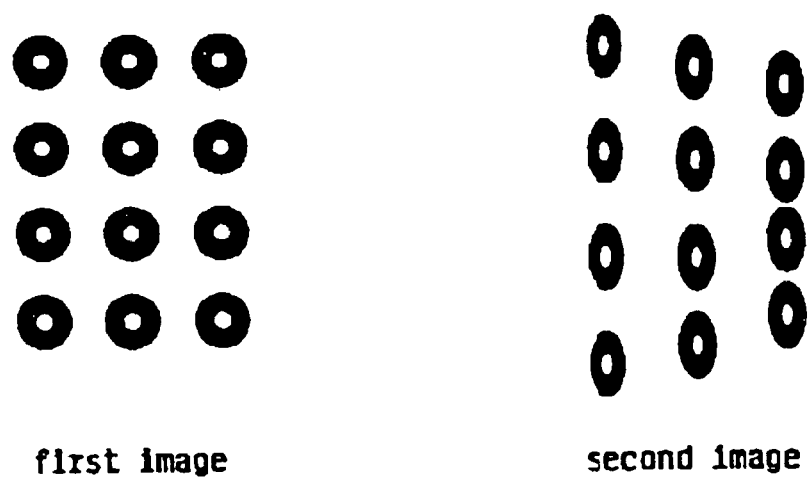
FIG. 2 shows an example of a first and second image such as recorded by the first and second camera.

Since the side of the ball-shaped element or even Gull-Wing or rectangular shaped element is illuminated, the first camera will record a characteristic doughnut-shape first image as shown in FIG. 2. It should be noted that the black parts in that FIG. 2 show the reflected light, whereas the white parts show the absence of reflection. However, in case of a damaged element, the doughnut-shape rapidly degrades due to scattering of the light on the damaged surface.

Figure 3A:
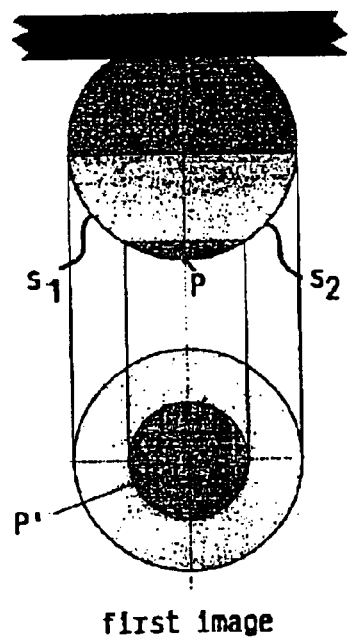
FIG. 3a and FIG. 3b illustrate schematically how the light originating from the light source is reflected towards the first camera.
Figure 3B:
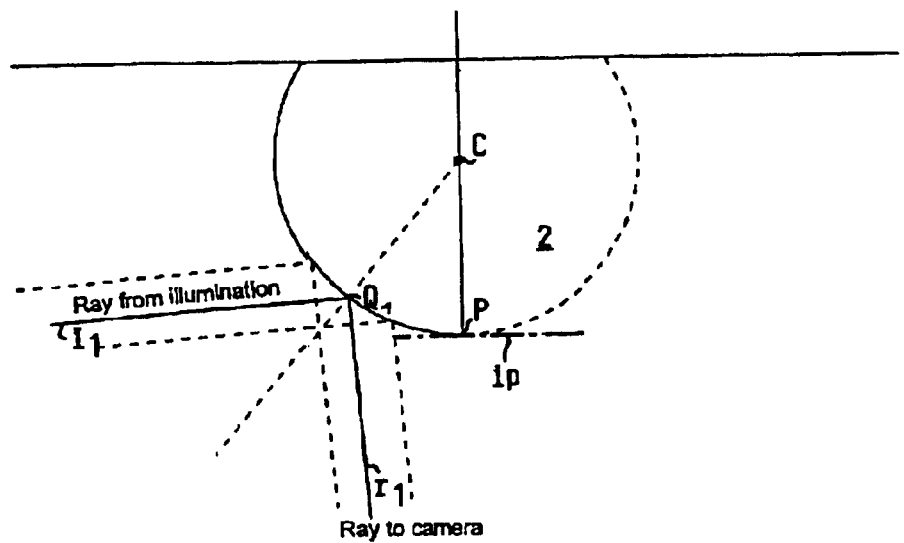

As is illustrated in the FIG. 3b, an incident light ray $i_1$ generated by the illumination source 5 hits the contact element 2 in a point Q and is reflected as a reflected ray $r_1$ towards the first camera 3 where the first image is formed. Due to the set up of the illumination source and the first camera, a light ray $i_p$ incident on the point P situated on top of the ball is not reflected towards the first camera. Thus, as illustrated in FIG. 3a, only the light incident on the ring shaped areas $s_1$ and $s_2$ on the ball surface will be reflected towards the first camera, leading to the doughnut structure of the first image. Such a set up provides a high image quality with no influence of the substrate on which the contact elements are placed and which substrate is generally made of plastic or ceramic material. As the centre of the first image corresponds to the position P, the X and Y co-ordinates of the latter can be measured.

Because the ball surface could be somewhat irregular, the reflections could be somewhat diffused. This signifies that a reflection cone is formed Instead of an ideal reflected light ray. This cone has a highest intensity along the ideal reflection angle and which diminishes when deviating from that ideal reflection angle. The opening angle of this cone depends on the ball surface properties. If the reflectivity is high, a narrow cone is formed, when not, the reflected light becomes more diffuse. In practice this means that the reflected light is observed over a wider range, strongest at the theoretical ring and diminishing towards the centre and the outer edge of the ball. A second factor is that the illumination source has a finite size and therefore generates a bundle of light rays with slightly different angles of Incidence which are typically in the order of magnitude of 4–6°.

Figure 4:
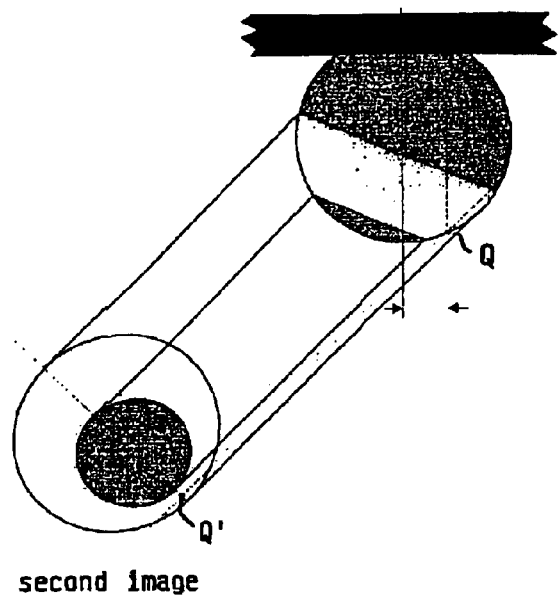
FIGS. 4 and 5 illustrate schematically the reflection of the light towards the second camera.
Figure 5:
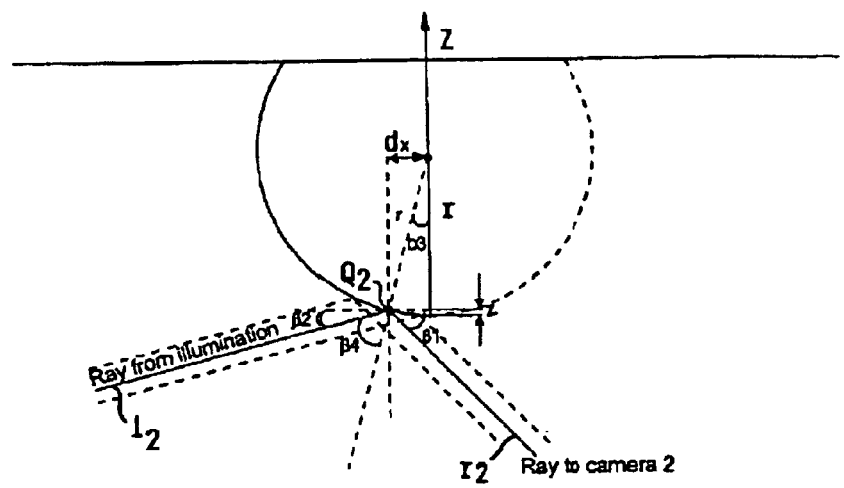

As illustrated in FIGS. 4 and 5, the second camera sees light reflected from another part of the contact element than the one recorded by the first camera, which leads to the fact that the black spot and the doughnut shape are situated at a different place in the second image recorded by the second camera. The latter records in particular light reflected by the bottom part of the contact element. In reality, the strongest reflection is a bit further up the slope of a right side of the ball and the dark spot moved towards the left offset with respect to the centre. This explains why an asymmetrical reflection is obtained in the second image.

The light path travelled by an incident ray $i_2$ and reflected towards the second camera is shown in FIG. 5. The incident ray $i_2$ hits the ball on a point $Q_2$ which is not situated at the bottom of the ball but offset over a distance z considered in Z direction. Incident ray $i_2$ is reflected as reflected ray $r_2$ towards the second camera. Suppose now that the triangulation angle α between the first and second camera is: α=90°−$β_1$ and that the ball has a radius of r=375 μm. Suppose also that incident angle $β_2$=15°. Since 2$β_4$+$β_1$+$β_2$=180°,$β_4$=½(180 −$β_1$−$β_2$). Further, since $β_3$+90°+$β_2$+$β_4$=180°, $β_3$=90−,$β_4$−$β_2$.

Thus, $β_4$=60° and $β_3$=15°.

Now the displacement in horizontal direction dx can be calculated dx=r.sin $β_3$=<>dx=97 μm. The distance z can now be calculated as follows r=Z+r cos $β_3$ thus z=r(1−cos $β_3$) with $β_3$=15°, z=12.7 μm.
So instead of measuring the bottom of the ball, a position which is at 12.7 μm inside the ball is measured. But since coplanarity is a relative measurement, the displacement z is nearly equal for all the contact elements to be measured and the coplanarity of the ball can be accurately measured despite the fact that a position inside the ball is considered.

The point Q to be measured on the ball surface will thus form an image point Q' in the second image, thus enabling to determine that position Q' in the second image. The position of Q' will on its turn enable to determine the Z co-ordinate of the contact element.

With the measurement principle according to the present invention, the centre of each $i^{th}$ contact element (1≦i≦N, where N is the total number of contact elements) is reconstructed by means of the first image whereas the second serves to determine the top of the ball surface of each $i^{th}$ contact element. That the second image shows a widening matrix of doughnuts and black spots is due to the triangulation angle at which the second camera is set up. The more the contact element is distant from the image field of the second camera, the larger the distance will be between neighbouring Images of the contact elements. This phenomenon, known as perspective distortion, can however mathematically easily be taken into account as it is completely determined by the dimension of the component and the position of the second camera and the lens characteristics. Another technique for eliminating the perspective distortion is the use of a tele-centric lens.

Before the measurement of the respective positions of the contact elements of an electronic component can be started, it is necessary to calibrate the apparatus in order to establish a relationship between a position $x_1$ in the first image and a corresponding position $X_3$ in the second image. In such a manner, a mapping algorithm can be determined enabling a mapping between both images. FIG. 6 illustrates that calibration. A calibration plate comprising a number of predetermined, accurately known positions, represented, for example, by crosses, is defined. That plate is for example, made of a substrate which is placed at the location provided for installing the electronic component to be measured. The substrate is, for example, made of glass on which the crosses are printed by using a highly accurate screen printing process. The first and second camera each record then a respective calibration image of that calibration plane, as shown in FIG. 6. For the latter measurement, it is not necessary that the calibration plane and the plane in which the contacts are situated are exactly corresponding, since only relative measurements are required.

In order to compute the co-ordinates in three dimensions of each contact element, the relative position of both cameras will now be determined by using the calibration plate. In order to obtain an accurate calibration, the position and the size of the crosses printed on the calibration plate are preferably known with an accuracy of $0.1\mu$. The calibration comprises the determination of the position of the crosses in the first and second image such as recorded by the first and second camera. Since the positions of the crosses on the calibration plane are accurately known, their respective positions in the first and second image are obtained by assigning their co-ordinates on the calibration plate to the one in their respective image. In such a manner, a calibration plane is determined in the image field. For all the intermediate points between each rectangle of four crosses, a bilinear interpolation technique is used to determine their co-ordinates. So for example a point X1 in the first image will be expressed in fractions of dx and dy and considered with respect to the rectangle formed by crosses 11, 12, 13 and 14. In order to match a point in the first image with a corresponding point in the second image, a mapping algorithm is determined, mapping the co-ordinates of for example a point 11 in the first image with the corresponding point 11' in the second image. The position of point $X_3$ in the second image and which corresponds with point $X_1$ in the first image is then also expressed in fractions of dx' and dy'.

The calibration procedure thus enables to determine the scaling factors to convert a pixel position in the first or second image to a position of the contact elements on the component. As the position is accurately determined by the calibration plate, the position of the contact elements can also be determined accurately in microns. The calibration procedure also enables to determine a camera to camera calibration, establishing the relation between the first and second camera.

Now that the calibration plane has been determined and the set-up of the first and second camera has been explained, the measurement principle according to the present invention will be explained. The consecutive steps of the method are shown in FIG. 7. Suppose that the top of an $i^{th}$ ball shaped contact element is located at a point P with respect to the calibration plane p. From the doughnut shaped first image, as recorded by the first camera, the centre can be determined. This centre corresponds to a pixel situated at a point $X_1$ in the first image. Thus $X_1$ gives the position in the first image of a first reference point corresponding to the centre of the $i^{th}$ contact element of the component.

In a second step, the point P is orthogonally projected on the calibration plane giving a point P'. In the second image, as recorded by the second camera disposed over a triangulation angle $\alpha$, the point $X_3$ is then the image point of position P'. $X_3$ is thus the expected position in case the ball would be localised in the calibration plane.

In a third step, the position of a point $X_4$ in the second image is determined by using the light intensity around measurement point Q'(see FIG. 4). Q' is the predicted position of the top of the ball in the second image. The position of point $X_4$ is determined by considering the moon-like shaped pattern in the second image which represents the reflection of the top part of the ball. The displacement between $X_3$ and $X_4$ is due to the fact that the real contact element is usually not exactly in the calibration plane but at a height difference $\Delta z$, which is the one to be measured. In this step the Z tolerance and the tilt of the component are compensated as the measurement is done relatively with respect to the calibration plane which is the same for all the balls of the component.

Now that the position of $X_4$ is determined, the latter can be mapped into the first image. Therefore $X_4$ is mapped on the calibration plane leading to a point P''' which co-ordinates can be determined by using the calibration algorithm. Indeed, since the co-ordinates of $X_4$ are known in the second image, they can be mapped on the calibration plane and expressed in fractions of dx' and dy' relative to their appertaining quadrant. Optically, position $X_4$ is projected on the calibration plane p, leading to the point P''', which on its turn forms a fourth image point $X_2$ in the first image. The mapping algorithm determined during calibration, now enables to map $X_4$ into the first image and to determine the coordinates of $X_2$. This can be done because the scaling factor in the first image, converting the pixel position to the real position in microns of the contact element, is accurately known in the first image. In the second image, the scaling factor varies over the surface of the image because of the large perspective distortion. The distance $\Delta X$ between $X_1$ and $X_2$ is directly proportional to $\Delta Z$ which is the height of the ball to be measured, or the difference between the calibration plane and the top of the ball. Because triangle P P''' S is rectangular With P P''' as hypotenuse, $(P\ P''')^2 = (PS)^2 + (SP''')^2$ or $(P\ P''')^2 = (\Delta X)^2 + (\Delta Z)^2$. As relative measurements are only of interest, there is no need to exactly determine $\Delta Z$. So the value of $\Delta X$ will thus provide a value for the height of the ball to be measured.

The present method is insensitive for variations in the Z-position of the component and also for tilt. The method can compensate more than 1 mm in X or Y position and up to 10 degrees in rotation. Approximately $+/-400\mu$ in Z-variation and $+/-1$ degree in tilt for the largest devices can be compensated in the vertical direction. For CSP components with body sizes up to 10 mm, tilt can be maximally 2 degrees.

Figure 8:
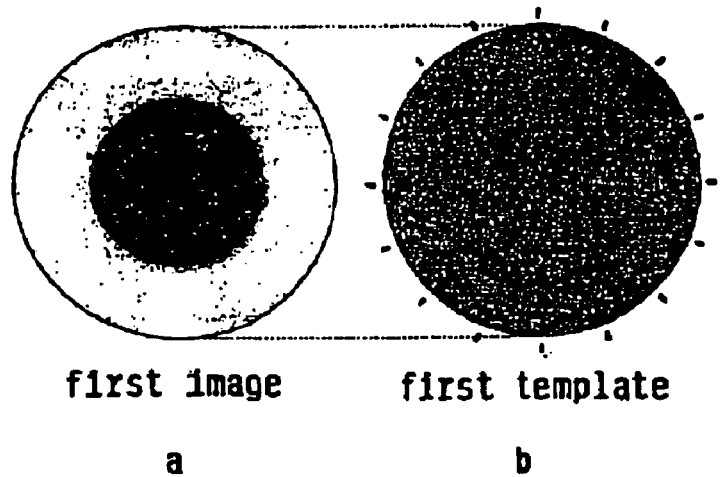
FIGS. 8 and 9 illustrate the convolution procedure applied on the first and second image.
Figure 9:
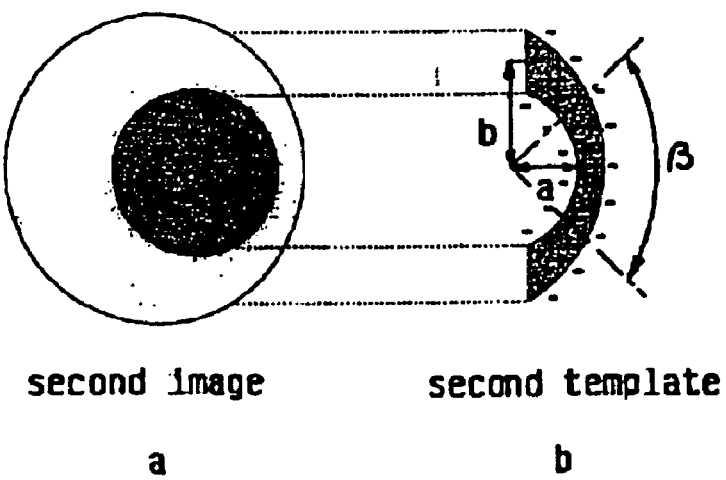

The determination of the co-ordinates of the points $X_1$ respectively $X_4$ in the first, respectively the second image will now be described in more details with reference to the FIGS. 8 and 9. FIG. 8a shows a doughnut shaped pattern such as recorded by the first camera. The centre of this doughnut should now be determined as it will give a position $X_1$ corresponding to the centre of the balls. For this purpose, a circular shaped first template as illustrated in FIG. 8b will be used. The radius of the circular shaped template corresponds to the one of the ball shaped contact element. A convolution operation with that circular shaped first template will then be realised on the doughnut present in the first image.

The first template comprises a set of point pairs of which a "+" point is placed at the inside of the template and a "−"

point at the outside of the template. The distance between a "+" point and a neighbouring "−" point is the admitted tolerance of the method. In order to perform the convolution operation, the template is shifted successively over each of the doughnuts of the first image. The template is shifted pixel by pixel over the doughnut and each time the following calculation is performed:

$$k = \sum_{+} greyvalue - \sum_{-} greyvalue$$

wherein $$\sum_{+} greyvalue$$

respectively $$\sum_{-} greyvalue$$

is the sum of the greyvalues of the pixels which coincide with a "+" respectively a "−" on the template. A matrix of k values is thus determined for the pixels of the first image, wherein $k_{ij}$ corresponds to the k value determined when the origin of the template was located at a pixel situated in an $i^{th}$ row and $j^{th}$ column within the first image. The position at which k has the maximum value will then correspond to the position of X1, i.e. when all "+" are within the doughnut. This position can be computed with an accuracy of approximately ⅕ to ⅒ of a pixel by using techniques which are based on the interpolation of the result of neighbouring points around the maximum. Of course other techniques such as filtering, edge detection or hough transformations could be used Instead of a convolution process for determining the co-ordinates.

An analogous process is then performed for the second image, however with a moon shaped second template as shown in FIG. 9b. The choice of the second template is of course related to the shape of the second image (FIGS. 4 and 9a). The elliptical moon-like shaped second template is described by the segment diameter a in horizontal direction and the segment diameter b in vertical direction as well as by the segment angle β defining the spherical part to be used, for example, β=140°.

The second template is shifted over the second image in an analogous manner as the first template is shifted over the first image. For each shift step, again a value k is determined and a maximum k value indicates the position of point $X_4$ in the second image. By using an appropriate interpolation technique, such as explained with reference to the calibration process, it is possible to compute the position of the templates with an accuracy up to ⅒ of a pixel.

The layout of the measurement apparatus according to the invention is shown in FIG. 10. It comprises preferably a stainless steel construction 20 where the illumination source 5, the first camera 3 and the second camera 4 are integrated. Because compactness is required to the limited space restrictions in most handlers, an additional mirror 21 is used to reduce the size of the apparatus. The electrical component to be measured is placed on top of the apparatus in a measurement plane 25. The first and the second camera are further connected with a data processing unit (not shown), for example a Personal Computer, provided for processing the data recorded by the cameras according to the principles set out here before.

The apparatus is insensitive for vibrations due to the rigid construction of stainless steel and due to the short image acquisition times. And even if the chip moves between the first and second image acquisition, this is a relative movement which takes place for all balls and can not be seen in the coplanarity results.

The accuracy of the determination of the position of the contact elements is directly proportional to the angle triangulation a between the first and the second camera. The higher the angle, the better the accuracy will be. In this configuration an angle of approximately 45 degrees has been used. Because of this large angle and because the components can have dimensions up to 40–50 mm, a field depth of 30 mm and more is required. This can normally not be achieved with standard lenses.

Therefore in the present apparatus an additional adaptor part 24 has been mounted between the CCD and the lens of the second camera 4. The adaptor tilts the two planes with respect to each other. As a consequence the image plane will be rotated with respect to the object plane in such a way that the projection is sharp. The physical background is explained with respect to FIG. 12.

The upper part of 12 shows the projection as it takes place with a standard lens/camera configuration. The bottom part shows the same object but not tilted with an angle of approximately 45 degrees. In order to achieve a sharp image in the image plane, the CCD must be rotated. This is accomplished with the adaptor part. The adaptor part ensures that the image of the component seen under 45° is completely in focus. This is compensated by using the calibration techniques as explained hereabove. A similar set-up can be achieved by using a tele-centric lens which has the additional advantage of eliminating the perspective distortion.

FIG. 11 also shows the integration of a coaxial illumination 22 in the measurement apparatus. Although this is not immediately required for the reconstruction method of the balls, according to the invention it is useful for the following reasons:

1) the coaxial illumination 22 in combination with the half transparent mirror 23 enables a visualisation of the area between the balls. In such a manner it becomes possible to detect solder or dust particles, which could be present in the area between the contact elements;
2) it will also allow, in combination with the ring-light under an oblique angle to detect damaged and smashed balls due to probe pins;
3) last but not least, the coaxial illumination provides a suitable way to illuminate the calibration plate during the calibration.

The coaxial illumination is preferably placed under the mirror 21 enabling to provide sufficient space for placing the half transparent mirror 23 without interfering with the other mirror 21 and the illumination source 5. The half transparent mirror reflects the light from the coaxial illumination 22 towards the component 1 and enables light, reflected by the component, to cross that mirror and reach the cameras 3 and 4.

According to the present invention, it is either possible to acquire the first and second image separately or, since a same illumination source 5 is used for both Images, to acquire them simultaneously. The acquisition time will be in the order of 70 ms. So both cameras can be triggered separately or simultaneously. As both images can be recorded simultaneously, they can be acquired "on the fly" which is important for reducing the integration complexity and for reducing standstill time. Thus the components can successively be presented. The processing of each image has to be done separately, starting with the first image, as the data of each image is necessary to obtain the required position of the electronic component.

What is claimed is:

1. A method for measuring respective positions of a set of N contact elements of an electronic component comprising:

bringing said set of elements into a measurement plane;

illuminating said set of elements in said measurement plane with a substantially homogeneous light source producing a light with an incident angle on said elements of at most 20°;

recording a first image of said elements illuminated by said light source with a first camera having a first image plane extending substantially parallel to said measurement plane;

recording a second image of said elements illuminated by said light source with a second camera set up over a triangulation angle α with respect to said first camera and said measurement plane, said triangulation angle being situated between 25° and 80°;

determining within said first image for each $i^{th}$ ($1 \leq i \leq N$) element, a first image point X1 of a first reference point situated on each of said elements;

determining within said second image a second image point X3 by mapping with respect to a calibration plane each time said first image point X1 into said second image;

determining within said second image, a third image point X4 being the image of said first reference point;

determining within said first image a fourth image point X2 by mapping said third image point into said first image;

determining within said first image a displacement $\Delta x_i$ between said first and fourth image point, and determining from said displacement $\Delta x_i$ and said first image point the position of said $i^{th}$ element.

2. A method as claimed in claim 1, characterised in that said first X1 and third image point X4 are determined by means of a convolution operation with a predetermined convolution pattern.

3. A method as claimed in claim 2, characterised in that said convolution pattern is a circle for said first image and an ellipse shaped curve for said second image.

4. A method as claimed in any one of the claims 1 to 3, characterised in that said reference point is situated offset of a top of said element.

5. An apparatus for measuring respective positions of a set of N contact elements of an electronic component, said apparatus comprises an illumination source provided for illuminating a measurement plane in which said contact elements are to be disposed, characterised in that said illumination source is provided for generating a substantially homogeneous light source with an incident angle of at the most 20° on said elements, said device further comprises a first and a second camera set up over a triangulation angle α with respect to each other and said measurement plane, said triangulation angle α being situated between 25° and 80°, said first and second camera being provided for recording a first and second image respectively, said first and second camera being connected to a processing device provided for retrieving a first position X1 and a third position X4 from said first and second image and for determining said position from said first and third position.

6. An apparatus as claimed in claim 5, characterised in that it comprises a mirror and wherein said mirror and said second camera are positioned in such a manner as to orient light reflected by said component into said second camera.

7. An apparatus as claimed in claim 6, characterised in that said second camera comprises an adapter part placed between an image plane and a lens of said second camera.

8. An apparatus as claimed in any one of the claims 5–7, characterised in that it comprises a coaxial illumination.

* * * * *

(12) EX PARTE REEXAMINATION CERTIFICATE (6604th)
United States Patent
Smets et al.

(10) Number: US 6,778,282 C1
(45) Certificate Issued: Jan. 6, 2009

(54) MEASURING POSITIONS OF COPLANARITY OF CONTRACT ELEMENTS OF AN ELECTRONIC COMPONENT WITH A FLAT ILLUMINATION AND TWO CAMERAS

(75) Inventors: Carl Smets, Haasrode (BE); Karel Van Gils, Blanden (BE); Maarten Van Der Burgt, Kessel-Lo (BE)

(73) Assignee: ICOS Vision Systems N.V., Heverlee (BE)

Reexamination Request:
No. 90/007,356, Dec. 22, 2004

Reexamination Certificate for:
Patent No.: 6,778,282
Issued: Aug. 17, 2004
Appl. No.: 09/958,516
Filed: Oct. 10, 2001

(22) PCT Filed: Mar. 1, 2000
(86) PCT No.: PCT/BE00/00020
§ 371 (c)(1), (2), (4) Date: Oct. 10, 2001
(87) PCT Pub. No.: WO00/62012
PCT Pub. Date: Oct. 19, 2000

(30) Foreign Application Priority Data
Apr. 13, 1999 (EP) .......................................... 99201121

(51) Int. Cl.
*G01B 11/14* (2006.01)

(52) U.S. Cl. ..................... 356/614; 356/237.1; 382/145; 382/149
(58) Field of Classification Search .................... None
See application file for complete search history.

(56) References Cited

U.S. PATENT DOCUMENTS

| | | |
|---|---|---|
| 3,534,019 A | 10/1970 | Coyne et al. |
| 3,671,726 A | 6/1972 | Kerr et al. |
| 4,259,589 A | 3/1981 | DiMatteo et al. |
| 4,314,763 A | 2/1982 | Steigmeier et al. |
| 4,555,798 A | 11/1985 | Broadbent, Jr. et al. |
| 4,589,141 A | 5/1986 | Christian et al. |
| 4,601,053 A | 7/1986 | Grumet |
| 4,677,473 A | 6/1987 | Okamoto et al. |
| 4,686,565 A | 8/1987 | Ando |
| 4,688,939 A | 8/1987 | Ray |
| 4,715,921 A | 12/1987 | Maher et al. |
| 4,733,969 A | 3/1988 | Case et al. |
| 4,739,175 A | 4/1988 | Tamura |
| 4,772,125 A | 9/1988 | Yoshimura et al. |
| 4,774,403 A | 9/1988 | Arts et al. |
| 4,785,177 A | 11/1988 | Besocke |
| 4,793,707 A | 12/1988 | Hata et al. |

(Continued)

FOREIGN PATENT DOCUMENTS

| CA | 2282498 | 9/1998 |
| CN | 1662790 | 5/2003 |
| DE | 0677739 | 7/1939 |

(Continued)

OTHER PUBLICATIONS

Transcript of hearing in Case No. 00 Civ. 4992 (DC), *Scanner Technologies v. Icos Vision Systems*, New York, N.Y., Nov. 7–8, 2001, pp. 1–233.

Transcript of trial in Case No. 00 Civ. 4992 (DC), *Scanner Technologies v. Icos Vision Systems*, New York, N.Y., Mar. 14–18 & 24, 2005, pp. 1–874.

(Continued)

*Primary Examiner*—Minh Nguyen

(57) ABSTRACT

A method and an apparatus for measuring respective positions of a set of contact elements of an electronic component, wherein the contact elements are illuminated with a light source producing a light with an incident angle of at the most 20° and wherein a first respectively a second image is recorded of said elements by means of a first respectively a second camera which are set up over a triangulation angle with respect to each other.

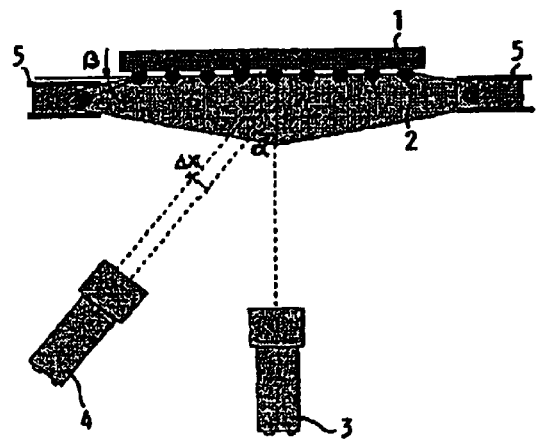

U.S. PATENT DOCUMENTS

| | | |
|---|---|---|
| 4,818,110 A | 4/1989 | Davidson |
| 4,852,516 A | 8/1989 | Rubin et al. |
| 4,891,772 A | 1/1990 | Case et al. |
| 4,893,183 A | 1/1990 | Nayar |
| 4,904,012 A | 2/1990 | Nishiguchi et al. |
| 4,959,898 A | 10/1990 | Landman |
| 5,003,600 A | 3/1991 | Deason |
| 5,013,311 A | 5/1991 | Nouri |
| 5,023,917 A | 6/1991 | Bose |
| 5,024,529 A | 6/1991 | Svetkoff et al. |
| 5,032,735 A | 7/1991 | Kobayashi |
| 5,043,589 A | 8/1991 | Smedt et al. |
| 5,058,178 A | 10/1991 | Ray |
| 5,105,149 A | 4/1992 | Tokura |
| 5,140,643 A | 8/1992 | Izumi et al. |
| 5,142,357 A | 8/1992 | Lipton |
| 5,173,796 A | 12/1992 | Palm |
| 5,239,355 A | 8/1993 | Hirose |
| 5,343,294 A | 8/1994 | Kuckel |
| 5,347,363 A | 9/1994 | Yamanaka |
| 5,355,283 A | 10/1994 | Marrs et al. |
| 5,364,219 A | 11/1994 | Takahashi et al. |
| 5,380,682 A | 1/1995 | Edwards et al. |
| 5,383,013 A | 1/1995 | Cox |
| 5,410,259 A | 4/1995 | Fujihara et al. |
| 5,414,458 A | 5/1995 | Harris et al. |
| 5,422,852 A | 6/1995 | Houston et al. |
| 5,444,296 A | 8/1995 | Kaul et al. |
| 5,452,080 A | 9/1995 | Tomiya |
| 5,465,152 A | 11/1995 | Bilodeau |
| 5,528,371 A | 6/1996 | Sato |
| 5,546,189 A | 8/1996 | Svetkoff |
| 5,559,727 A | 9/1996 | Deley |
| 5,561,696 A | 10/1996 | Adams et al. |
| 5,563,703 A | 10/1996 | Lebeau |
| 5,574,668 A | 11/1996 | Beaty |
| 5,574,801 A | 11/1996 | Collet-Beillon |
| 5,592,562 A | 1/1997 | Rooks |
| 5,617,209 A | 4/1997 | Svetkoff |
| 5,621,530 A | 4/1997 | Marrable |
| 5,636,025 A | 6/1997 | Bieman |
| 5,648,853 A | 7/1997 | Stern |
| 5,652,658 A | 7/1997 | Jackson |
| 5,672,965 A | 9/1997 | Kurafuchi |
| 5,737,084 A | 4/1998 | Ishihara |
| 5,760,907 A | 6/1998 | Basler et al. |
| 5,798,195 A | 8/1998 | Nishi |
| 5,812,268 A | 9/1998 | Jackson |
| 5,815,275 A | 9/1998 | Svetkoff |
| 5,828,449 A | 10/1998 | King et al. |
| 5,832,107 A | 11/1998 | Choate |
| 5,835,133 A | 11/1998 | Moreton |
| 5,862,973 A | 1/1999 | Wasserman |
| 5,909,285 A | 6/1999 | Beaty et al. |
| 5,910,844 A | 6/1999 | Phillips et al. |
| 5,943,125 A | 8/1999 | King et al. |
| 5,956,134 A | 9/1999 | Roy et al. |
| 5,995,220 A | 11/1999 | Suzuki |
| 6,005,965 A | 12/1999 | Tsuda et al. |
| 6,028,671 A | 2/2000 | Svetkoff |
| 6,043,876 A | 3/2000 | Holliday |
| 6,053,687 A | 4/2000 | Kirkpatrick et al. |
| 6,055,055 A | 4/2000 | Toh |
| 6,064,756 A | 5/2000 | Beaty et al. |
| 6,064,757 A | 5/2000 | Beaty et al. |
| 6,072,898 A | 6/2000 | Beaty et al. |
| 6,098,031 A | 8/2000 | Svetkoff |
| 6,100,922 A | 8/2000 | Honda |
| 6,118,540 A | 9/2000 | Roy et al. |
| 6,128,034 A | 10/2000 | Harris |
| 6,166,393 A | 12/2000 | Paul et al. |
| 6,177,682 B1 | 1/2001 | Bartulovic |
| 6,198,529 B1 | 3/2001 | Clark, Jr. et al. |
| 6,201,892 B1 | 3/2001 | Ludlow et al. |
| 6,236,747 B1 | 5/2001 | King et al. |
| 6,242,756 B1 | 6/2001 | Toh et al. |
| 6,262,803 B1 | 7/2001 | Hallerman |
| 6,307,210 B1 | 10/2001 | Suzuki |
| 6,334,922 B1 | 1/2002 | Tanaka et al. |
| 6,336,787 B1 | 1/2002 | Chang et al. |
| 6,371,637 B1 | 4/2002 | Atchinson et al. |
| 6,373,565 B1 | 4/2002 | Kafka et al. |
| 6,407,809 B1 | 6/2002 | Finarov et al. |
| 6,437,312 B1 | 8/2002 | Adler |
| 6,452,201 B1 | 9/2002 | Wang et al. |
| 6,504,144 B1 | 1/2003 | Murata |
| 6,518,997 B1 | 2/2003 | Chow et al. |
| 6,525,331 B1 | 2/2003 | Ngoi |
| 6,539,107 B1 | 3/2003 | Michael |
| 6,587,193 B1 | 7/2003 | Reinhron et al. |
| 6,592,318 B2 | 7/2003 | Aggarwal |
| 6,611,344 B1 | 8/2003 | Chuang et al. |
| 6,636,302 B2 | 10/2003 | Nikoonahad et al. |
| 6,671,397 B1 | 12/2003 | Mahon |
| 6,745,637 B2 | 6/2004 | Tegeder et al. |
| 6,778,282 B1 | 8/2004 | Smets et al. |
| 6,813,016 B2 | 11/2004 | Quist |
| 6,862,365 B1 | 3/2005 | Beaty et al. |
| 6,915,006 B2 | 7/2005 | Beaty et al. |
| 6,915,007 B2 | 7/2005 | Beaty et al. |
| 6,970,238 B2 | 11/2005 | Gerhard et al. |
| 7,079,678 B2 | 7/2006 | Beaty et al. |
| 7,085,411 B2 | 8/2006 | Beaty et al. |
| 2002/0012502 A1 | 1/2002 | Farrar et al. |
| 2002/0034324 A1 | 3/2002 | Beaty et al. |
| 2002/0037098 A1 | 3/2002 | Beaty et al. |
| 2003/0133776 A1 | 7/2003 | Lee |
| 2004/0085549 A1 | 5/2004 | Smets et al. |
| 2004/0099710 A1 | 5/2004 | Sommer |

FOREIGN PATENT DOCUMENTS

| | | |
|---|---|---|
| DE | 3534019 A1 | 4/1987 |
| DE | 4304301 A1 | 8/1994 |
| DE | 4422861 A1 | 1/1996 |
| DE | 19734074 A1 | 2/1998 |
| EP | 0335559 A2 | 10/1989 |
| EP | 0385625 A2 | 9/1990 |
| EP | 0377464 A2 | 11/1990 |
| EP | 0485803 A1 | 5/1992 |
| EP | 0557558 A1 | 9/1993 |
| EP | 0638801 | 2/1995 |
| EP | 0677739 A1 | 10/1995 |
| EP | 0679864 A1 | 11/1995 |
| EP | 0696733 A1 | 2/1996 |
| EP | 0742898 | 11/1996 |
| EP | 0994328 | 4/2000 |
| EP | 1014438 | 6/2000 |
| EP | 1220596 A1 | 7/2002 |
| EP | 1233442 A2 | 8/2002 |
| EP | 1371939 A1 | 12/2003 |
| EP | 1619623 A1 | 1/2006 |
| JP | 6288009 | 4/1987 |
| JP | 2206709 | 8/1990 |
| JP | 2232506 | 9/1990 |
| JP | 3210410 | 9/1991 |
| JP | 4198846 | 7/1992 |
| JP | 4346011 | 12/1992 |
| JP | 06003124 | 1/1994 |
| JP | 6137825 | 5/1994 |
| JP | 6160057 | 6/1994 |
| JP | 7151522 | 6/1995 |

| | | |
|---|---|---|
| JP | 7209199 | 8/1995 |
| JP | 07320062 | 12/1995 |
| JP | 08115964 | 5/1996 |
| JP | 08122273 | 5/1996 |
| JP | 0942946 | 2/1997 |
| JP | 0989536 | 4/1997 |
| JP | 9304030 | 11/1997 |
| JP | 1026591 | 1/1998 |
| JP | 1062121 | 3/1998 |
| JP | 10104033 | 4/1998 |
| JP | 10148517 | 6/1998 |
| JP | 10227620 | 8/1998 |
| JP | 10227623 | 8/1998 |
| JP | 10232114 | 8/1998 |
| JP | 116965 | 1/1999 |
| JP | 1164232 | 3/1999 |
| JP | 11231228 | 8/1999 |
| JP | 11351841 | 12/1999 |
| JP | 200098257 | 4/2000 |
| JP | 2000352661 | 12/2000 |
| JP | 2002217250 | 8/2002 |
| WO | WO911535 | 9/1991 |
| WO | WO9521376 | 8/1995 |
| WO | WO9511519 | 8/1996 |
| WO | WO9802716 | 1/1998 |
| WO | WO9850757 | 11/1998 |
| WO | WO 9900661 | 1/1999 |
| WO | WO9904245 | 1/1999 |
| WO | WO9920977 | 4/1999 |
| WO | WO 99/36881 | 7/1999 |
| WO | WO9941597 | 8/1999 |
| WO | WO9945370 | 9/1999 |
| WO | WO99/62107 | 12/1999 |
| WO | WO0038494 | 6/2000 |
| WO | WO0062012 | 10/2000 |
| WO | WO01/79822 A1 | 10/2001 |
| WO | WO 02/054849 | 7/2002 |
| WO | WO02/054849 A1 | 7/2002 |
| WO | WO03/027748 A1 | 4/2003 |
| WO | WO03/098148 A1 | 11/2003 |
| WO | WO2004/056678 A2 | 7/2004 |

OTHER PUBLICATIONS

CI–8250 The Complete High Speed Inspection System, ICOS Product Pamphlet, Mar. 1997.
C. Smets, K. van Gils, L. Vanderheydt, "A System for 2D and 3D inspection of BGA's Using Vision," Ball Grid Array (BGA) Packaging and Assembly Conference, Singapore, Jan. 16, 1995.
Lau, John, Ball Grid Array Technology, McGraw–Hill, New York, NY, 1995.
Hwang, Jennie S, Ball Grid Array & Fine Pitch Peripheral Interconnections, Electrochemmical Publications, Isle of Man, British Isles, 1995.
Blanz, W.E. et al., "Image Analysis Methods for Solder Ball Inspection in Integrated Circuit Manufacturing," IBM Almaden Research Center, San Jose, CA, 1987.
Schurr, George, "Basics of Stereoscopic Machine Vision for 3D Gauging," International Roberts & Vision Automation Show and Conference Proceedings: Fighting Back with . . . .
Fandrich, Jurgen et al., "Agile Automated Vision," SPIE vol. 2249, Automated 3D and 2D Vision, 1994.
"BGA 3D Inspection System".
"ICOS 3–Dimensional BGA Inspection System: Specification," Oct. 22, 1996.
Helm J.D. et al, Improved three–dimensional image correlation for surface displacement measurement, Optical Engineering 34(07), 1911–1920, 1996.
Faugeras Olivier, "Three–Dimensional Computer Vision: A Geometric Viewpoint," Cambridge, Massachusetts, XP002316574.
Faugeras Olivier, "Three–Dimensional Computer Vision: A Geometric Viewpoint," Cambridge, Massachusetts, XP002316575.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2 and 5 are cancelled.

Claims 1, 3 and 6–8 are determined to be patentable as amended.

Claim 4, dependent on an amended claim, is determined to be patentable.

1. A method for measuring respective positions of [a set of] *all of* N contact elements of an electronic component comprising:
   bringing said [set of] elements into a measurement plane;
   illuminating said set of elements in said measurement plane with a substantially homogeneous light source producing a light with an incident angle on said elements of at most 20°;
   recording a first image of said elements illuminated by said light source with a first camera having a first image plane extending substantially parallel to said measurement plane;
   recording a second image of said elements illuminated by said light source with a second camera set up over a triangulation angle α with respect to said first camera and said measurement plane, said triangulation angle being situated between 25° and 80°;
   determining within said first image for each $i^{th}$ ($1 \leq i \leq N$) element, a first image point X1 of a first reference point situated on each of said elements;
   determining within said second image a second image point X3 by mapping, *based on linear interpolation*, with respect to a calibration plane [each time] said first image point X1 into said second image;
   determining within said second image, a third image point X4 being the image of said first reference point;
   determining within said first image a fourth image point X2 by mapping, *based on linear interpolation*, said third image point into said first image;
   determining within said first image a displacement $\Delta x_i$ between said first and fourth image point, and
   determining from said displacement $\Delta x_i$ and said first image point the position of said $i^{th}$ element; *and*
   *characterized in that said first X1 and third image point X4 are determined by means of a convolution operation with a predetermined convolution pattern.*

3. A method as claimed in claim [2] *1*, characterised in that said convolution pattern is a circle for said first image and an ellipse shaped curve for said second image.

6. [An apparatus as claimed in claim 5, characterised in that it comprises] *The method of claim 1, further comprising positioning* a mirror and wherein said mirror and said second camera are positioned in such a manner as to orient light reflected by said component into said second camera *at an angle of about 45 degrees and wherein the optical axis of the second mirror crosses the optical axis of the first mirror*.

7. [An apparatus as claimed in] *The method of* claim 6, [characterised in that said second camera comprises] *further comprising positioning* an adapter part placed between an image plane and a lens of said second camera, *wherein said adapter tilts an image detector located within the second camera with respect to a plane of a lens of the second camera*.

8. [An apparatus] *The method* as claimed in any one of the claims [5–7] *1, 3–4 and 6–7*, [characterised in that it] *wherein said step of illumination* comprises a coaxial illumination.

* * * * *